United States Patent [19]

Watanabe et al.

[11] Patent Number: 5,279,623
[45] Date of Patent: Jan. 18, 1994

[54] METHOD OF FABRICATING FLAT TYPE ELECTROCHEMICAL DEVICE

[75] Inventors: Kouichi Watanabe; Kunio Nishida; Tatsuo Kunishi; Masanori Endo; Shunjiro Imagawa, all of Nagaokakyo, Japan

[73] Assignee: Murata Manufacturing Co., Ltd., Japan

[21] Appl. No.: 919,854

[22] Filed: Jul. 27, 1992

[51] Int. Cl.5 .............................................. H01L 21/52
[52] U.S. Cl. .................... 29/25.03; 29/25.02; 29/25.42; 437/209; 437/217; 437/220
[58] Field of Search ............... 29/25.03, 25.02, 25.42; 437/209, 217, 220

[56] References Cited

U.S. PATENT DOCUMENTS

| | | | |
|---|---|---|---|
| 4,594,770 | 6/1986 | Butt | 437/220 |
| 4,597,028 | 6/1986 | Yoshida et al. | 29/25.42 |
| 4,748,537 | 5/1988 | Hernandez et al. | 29/25.42 |
| 4,920,641 | 5/1990 | Nakamura | 29/25.42 |
| 5,040,091 | 8/1991 | Yamaoka et al. | 25/25.42 |
| 5,139,972 | 8/1992 | Neugebauer et al. | 437/209 |

Primary Examiner—Brian E. Hearn
Assistant Examiner—Kevin M. Picardat
Attorney, Agent, or Firm—Ostrolenk, Faber, Gerb & Soffen

[57] ABSTRACT

A method of fabricating a flat type electrochemical device, which is constructed by placing in a case comprising first and second case half bodies a separator and first and second functional substances for an electrochemical device so arranged as to interpose the separator. Peripheral portions of the first and second case half bodies are overlapped with each other, the peripheral portions are welded by a welding process during the application of pressure whereby the peripheral portions are joined with substantially no gaps. The portions welded by the welding process with pressure are then further welded using a laser beam welding.

8 Claims, 2 Drawing Sheets

METHOD OF FABRICATING FLAT TYPE ELECTROCHEMICAL DEVICE

BACKGROUND OF THE INVENTION

1. Field of the Invention

The present invention relates generally to a method of fabricating an electrochemical device such as an electric double layer capacitor or a battery, and more particularly, to a method of fabricating a flat type electrochemical device comprising a case having a flat shape.

2. Description of the Prior Art

In an IC card and a thin-type portable electronic apparatus, a thin, that is, a flat power supply device is used. For the power supply device to be constructed in a flat shape, an electric double layer capacitor and a lithium secondary battery are particularly suitable. However, the electric double layer capacitor and the lithium secondary battery use a nonaqueous electrolytic solution. If the moisture content in the inner portion of the power supply device is increased by the entrance of moisture from the exterior, degradation of characteristics such as a decrease in withstand voltage is liable to occur. Consequently, a case structure capable of maintaining a highly sealed state for a long period of time is required.

A flat type electrochemical device having a structure meeting the above described requirements is disclosed in Japanese Patent Laid-Open Gazette No. 140553/1989. The structure disclosed in the prior art is shown in a cross sectional view and a plan view of in FIGS. 2 and 3.

In a flat type electrochemical device 1, a case half body 2a and a case half body 2b made of a thin metal plate or metal foil having a thickness of, for example, not more than 50 μm, are welded in their peripheral portions, thereby constructing a case 2. More specifically, a space is formed in a region inside the peripheral portions of the case half bodies 2a and 2b. A separator 3 and first and second functional substances 4a and 4b for the electrochemical device are contained in the space, and arranged so as to interpose the separator 3 between the functional substances 4a and 4b.

Reference numeral 5 denotes a terminal plate, which is arranged on the first functional substance 4a so as to be electrically connected to the first functional substance 4a. The upper surface of the terminal plate 5 is bonded to an inner flat surface, which faces the containing space, of the first case half body 2a while being separated therefrom by an insulating layer 6.

The electrochemical device 1 has an opening 7 formed in the first case half body 2a, and the terminal plate 5 is exposed at the opening 7, so that the terminal plate 5 and, therefore, the first functional substance 4a can be electrically connected to the exterior.

In the electrochemical device 1, the peripheral portions of the case half bodies 2a and 2b are welded, and the lower periphery of the opening 7 is sealed with the insulating layer 6, thereby sealing the space in the case 2. Moreover, the opening for electrically connecting the functional substance 4a to the exterior is limited to the portion of the insulating layer 6 that faces the opening 7, so that the region from which moisture can enter is relatively small, thereby enhancing sealing performance.

However, the electrochemical device 1 as shown in FIGS. 2 and 3 has the following disadvantages.

The electrochemical device 1 has a disadvantage in that the members contained in the case 2, for example, the separator 3, the functional substances 4a and 4b. Moreover, the like do not have sufficient heat resistance, and the case 2 is easily deformed by distortion because it has an overall flat shape. Accordingly, the welding process that can be used in joining the case half bodies 2a and 2b is limited.

SUMMARY OF THE INVENTION

As a result of examining a variety of welding processes that can be used, the inventors of the present application have found that two types of welding processes, that is, the laser beam welding and the micro plasma welding processes, are relatively suitable. In particularly, the laser beam welding is suitable for the purposes because the portion welded is hardly affected by heat.

In the laser beam welding, welding is done by localized heating for a short time of a portion to be welded, and thus the damage to the contents of the case by heating is prevented. In addition, the continuity of a welded portion is good. Accordingly, the laser beam welding is basically suitable for welding which requires airtightness.

In a case where very thin metal plates, having a thickness of not more than 50 μm, are overlapped with each other and welded in a manner similar to the first and second case half bodies 2a and 2b, as in the structure shown in FIG. 2, however, if even a slight gap remains between the two metal plates, heat is concentrated on the metal plate on the side of the irradiation of laser light whereby the metal plate is fused. Particularly, in the structure shown in FIG. 2, the case half body 2a is in a shape which has the containing space formed by squeezing processing (stamping). However, it is very difficult to form a portion, for welding, that is, to form a peripheral portion 8a, so as to be completely flat because of processing distortion in the case of stamped. As a result, a gap is liable to exist between the peripheral portion 8a of the case half body 2a and a peripheral portion 8b of the case half body 2b, so that the above described welding defects frequently occur. Therefore, as shown in FIG. 4 an attempt has been made to use the method of laser beam welding in a state where pressure is applied to both sides of a portion which is irradiated by laser light 11 using pressure jigs 12 and 13. A structure as shown in FIGS. 2 and 3, in which the peripheral portions are not welded, is mounted on a base 14, as shown in FIG. 4, and pressure is applied to the peripheral portion 8a using the pressure jigs 12 and 13. Laser light 11 is irradiated, onto the peripheral portion 8a while the pressure is applied so as, to do welding. A portion 15 outside the portion welded by the laser light 11 is cut off and removed after the welding.

When the above described welding process is used, the peripheral portions 8a and 8b of the first and second case half bodies 2a and 2b are bonded to each other while applying the pressure using the pressure jigs 12 and 13. Therefore, the occurrence of welding defects can be remarkably decreased. However, the welding defects cannot be completely removed. Accordingly, a phenomenon is observed that in a portion where a very small gap exits, the portion on the side of the case half body 2a is excessively melted to generate a hole.

Furthermore, there also arises a problem that the electrochemical device is increased in size because an additional portion is required on the peripheral portion 8a for positioning the pressure jig 13.

Moreover, there also arises a problem that the process of cutting and removing the portion 15, which is outside the welded portion must be carried out after the welding, thereby not only lead to a waste of materials but also to increase the number of process steps.

Laser beam welding is also done using either one of the pressure jigs 12 and 13, prior to the above described laser beam welding using both the pressure jigs 12 and 13. In this case, however, welding defects cannot be sufficiently prevented if only one of the pressure jig 12 or 13 is used.

As described the foregoing, in a method of applying pressure to the portion which is to be irradiated by the laser light 11 using the pressure jigs 12 and 13, and using the laser beam welding, cannot completely remove welding defects. This is caused by the fact that the flexural strength of the thin metal plate constituting the case half bodies 2a and 2b is low. Particularly, when distortion exists in the peripheral portions 8a and 8b, the distortion is liable to be concentrated at a portion which is not pressed by the pressure jig 12 or 13. Consequently, the portion to which pressure should be applied must be accurately selected for applying pressure using the pressure jigs 12 and 13. However, such a portion where distortion can occur varies considerably. Accordingly, it is actually impossible to select the above described portion to which pressure should be applied.

Additionally, in the case of the actual fabrication, it is actually impossible to make the squeezing depth of the case half body 2a and the total thickness of the contents contained therein equal to each other. More specifically, an inferior overlapping of the peripheral portions 8a and 8b is caused by the nonconformance of the height of the containing space and the total thickness of the contents, so that welding defects are liable to occur.

Accordingly, an object of the present invention is to provide a method of fabricating a flat type electrochemical device having a reliably sealed state without increasing the portion of the device to be welded.

In a method of fabricating a flat type electrochemical device according to the present invention, a flat type electrochemical device structure is first prepared comprising first and second case half bodies whose peripheral portions are overlapped with each other to construct a containing space inside of the peripheral portions. The electrochemical device is constructed by containing in the above described containing space at least a separator and first and second functional substances for an electrochemical device arranged so as to interpose the separator. In the above described electrochemical device structure, the peripheral portions of the first and second case half bodies are first welded by a welding process with pressure and then, the portions welded by the welding process with pressure are further hermetically sealed by laser beam welding.

The welding process with pressure is a general term for processes of joining portions to be welded to each other by applying pressure. Almost all of the processes include joining the portions to be welded to each other by applying pressure while being heated using electromagnetic energy or the like. The welding processes with pressure are classified into electric resistance welding, ultrasonic welding and the like depending on their energy sources. However, any one of the welding processes with pressure is considered suitable for the object of the present invention so long as the portions to be joined are welded while applying pressure.

Furthermore, in the welding process with pressure, heat generation is locally limited, so that the contents of the container are not adversely heat-affected. Among the welding processes with pressure, the electric resistance welding is the most common. When electric resistance welding is done, however, there are two types of welding, that is, continuous dot welding for broken line-shaped joining and linear welding referred to as seam welding. In the present invention, the latter, that is, the electric resistance seam welding is preferable because it is superior in workability.

In the present invention, various welding processes with pressure capable of linearly welding portions, in addition to the above described electric resistance seam welding, may be used.

The reason why reliable sealing cannot be achieved in the welding processes of the prior art is that a partial gap exists between the two metal plates overlapped with each other, and the gap cannot be removed by laser welding, by applying pressure to the portion which is irradiated by laser light, because an optical path of the laser light must be ensured in laser beam welding.

In the present invention, therefore, the peripheral portions of the first and second case half bodies which are overlapped with each other are welded by the welding process with pressure prior to the laser beam welding. As the result, a portion where the peripheral portions of the case half bodies are overlapped with each other is tack welded with no gap by the welding process with pressure. Consequently, the peripheral portions of the first and second case half bodies are reliably sealed by the laser beam welding subsequently done.

The above described tack welding is for joining the peripheral portions of the case half bodies with no gap prior to the laser beam welding. However, it is not necessary to achieve reliable sealing by the tack welding. That is, it is only necessary that the peripheral portions of the first and second case half bodies are joined to each other with no gap. Consequently, a welding process with pressure is used for such tack welding in the present invention.

Briefly stated, the present invention is characterized in that the peripheral portions of the case half bodies are welded, that is, tack welded by the welding process with pressure prior to the laser beam welding so as to make welding and sealing by the laser beam welding more reliable.

According to the present invention, the peripheral portions of the case half bodies are previously welded by the welding process with pressure, so that any gap between the peripheral portions overlapped with each other reliably disappears. Subsequently, the peripheral portions of the first and second half bodies are welded by the laser beam welding, thereby making it possible to produce a reliable sealed state of the welded portion. Accordingly, it is possible to provide a flat type electrochemical device whose performance is not degraded for long periods of time.

The foregoing and other objects, features, aspects and advantages of the present invention will become more apperent from the following detailed description of the present invention when taken in conjunction with the accompanying drawings.

DESCRIPTION OF THE PREFERRED EMBODIMENTS

The present invention is characterized by the process of welding first and second case half bodies constituting a case in a flat type electrochemical device. More specifically, the process for preparing a flat type electrochemical device structure before welding, which is constructed by containing a separator, first and second functional substances and the like in the first and second case half bodies, can be carried out in accordance with the conventionally known processes, for example, the process disclosed in Japanese Patent Laid-Open Gazette No. 140553/1989.

In the following description of the embodiment, therefore, description is made of the process of welding peripheral portions 8a and 8b of case half bodies 2a and 2b in a flat type electrochemical device 1 shown in FIG. 2.

Figure 2:
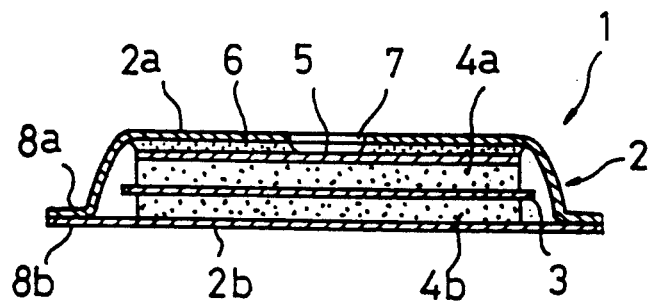
FIG. 2 is a cross sectional view of one example of a conventional flat type electrochemical device.

The case half bodies 2a and 2b shown in FIG. 2 are made of stainless plates having a thickness of 50 and 30 $\mu$m, respectively. More specifically, the stainless plate having a thickness of 50 $\mu$m is subjected to crimping or stamping to form the case half body 2a, while the flat plate-shaped stainless plate having a thickness of 30 $\mu$m is used to form the case half body 2b. In addition, as a terminal plate 5, a stainless plate having a thickness of 30 $\mu$m is prepared. As an insulating layer 6, a fusing film made of modified polyolefin resin having a carboxyl group grafted and having a thickness of 50 $\mu$m is used.

Meanwhile, a separator 3 and first and second functional substances 4a and 4b are replaced with a resin plate having dimensions of 11 mm by 29 mm by 0.3 mm thick as a dummy member.

The respective members prepared in the above described manner are then assembled as shown in FIG. 2, to fabricate 200 flat type electrochemical device structures. The case half bodies 2a and 2b are welded in accordance with the processes in the example and the comparative example as described below.

EXAMPLE

Figure 1:
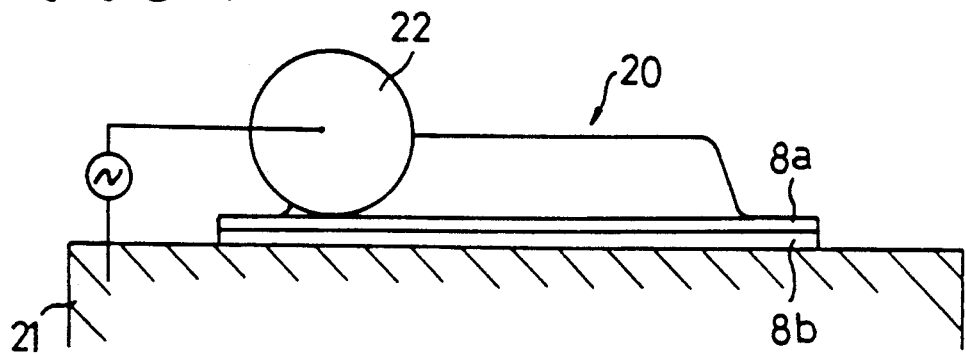
FIG. 1 is a cross sectional view showing the process of doing electric resistance seam welding as a welding process with pressure in an embodiment of the present invention.

As shown in FIG. 1, a flat type electrochemical device structure 20 before welding is mounted on a plate electrode 21, which also serves as a supporting plate, a circular disk-shaped rotating electrode 22 is run on the peripheral portions of the electrochemical device structure 20, and a voltage is applied between the rotating electrode 22 and the plate electrode 21, thereby doing electric resistance seam welding. In this case, the rotating electrode 22 is run on the peripheral portions of the electrochemical device structure 20 while pressure is applied to the peripheral portions from above by the rotating electrode 22.

As described in the foregoing, after the peripheral portions of the four sides of the electrochemical device structure 20 are tack welded, the portions thus linearly welded are welded again under the conditions of outputs of 18 to 26 W using a pulse oscillation type YAG laser.

The above described tack welding and laser beam welding are done with respect to 100 flat type electrochemical device structures.

The average dimensions of flat type electrochemical devices in mass production are approximately 16 mm by 34 mm by 0.5 mm thick. In the flat type electrochemical devices, produced by this method no sealing defects can be observed.

Figure 4:
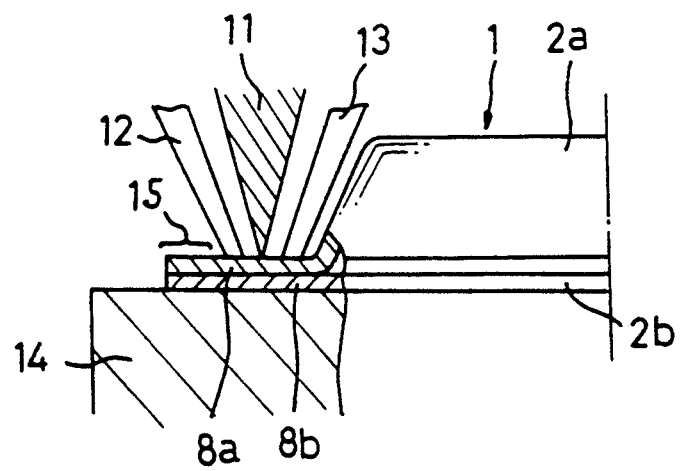
FIG. 4 is a partial sectional view of one example of welding processes in the related art.

COMPARATIVE EXAMPLE 100 flat type electrochemical device structures 20 are assembled in the same manner as the above example. Pressure is applied to the peripheral portions of each of the flat type electrochemical device structures 20 using the pressure jigs 12 and 13 shown in FIG. 4, to do welding under the same conditions as the above example using the pulse oscillation type YAG laser. Upon examining the sealed state thereby obtained in the flat type electrochemical devices, sealing defects occur in 13 flat type electrochemical devices. In any one of the electrochemical devices in which sealing defects occur, a pinhole is observed on a weld line of the case half body 2a.

Figure 3:
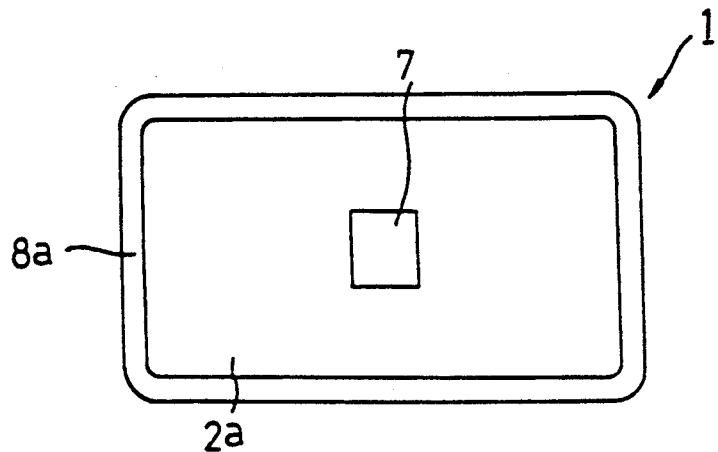
FIG. 3 is a plan view illustrating the flat type electrochemical device shown in FIG. 2.

Meanwhile, the present invention can be applied to not only a method of fabricating a flat type electrochemical device having a structure shown in FIGS. 2 and 3 but also as a method of fabricating a flat type electrochemical device having another structure which requires the that case half bodies be joined to each other in their peripheral portions by welding to achieve a highly sealed state.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of fabricating a flat type electrochemical device, comprising the steps of:
   (a) assembling a flat type electrochemical device, said electrochemical device comprising first and second case half bodies each having respective peripheral portions, the respective peripheral portions being overlapped with each other to form a containing space in between the corresponding case half bodies; at least a separator and first and second functional substances for an electrochemical device being contained in said containing space arranged so as to interpose said separator between said first and second functional substances;
   (b) welding said respective overlapped peripheral portions of said first and second case half bodies by a welding process, said welding process comprising the steps of applying pressure to said respective overlapped peripheral portions during said welding process whereby said respective overlapped peripheral portions of said first and second case half bodies are joined with substantially no gap therebetween; and then,
   (c) laser beam welding said respective overlapped peripheral portions welded in step (b) to hermetically seal said containing space.

2. The fabricating method according to claim 1, wherein electric resistance seam welding is used as said welding process in step (b).

3. The fabricating method according to claim 2, wherein said electric resistance seam welding is done by arranging said flat type electrochemical device structure on a plate electrode and running a circular disk-shaped rotating electrode on the peripheral portions of the flat type electrochemical device structure.

4. The fabricating method according to claim 1, wherein said laser beam welding is done using a YAG laser.

5. The fabricating method according to claim 1, wherein said electrochemical device further comprises an inner flat surface, which faces said containing space, of at least one of said first and second case half bodies; a terminal plate electrically connected to one of said first and second functional substances, said terminal plate being bonded to said inner flat surface of one of said case half bodies while being separated therefrom by an insulating layer; and an opening into said containing space is formed in said one of said case half bodies through which a part of said terminal plate is exposed to be connectable from outside said containing space.

6. The fabricating method according to claim 5, wherein said welding process in step (b) is carried out by electric resistance seam welding.

7. The fabricating method according to claim 6, wherein said electric resistance seam welding is done by arranging said flat type electrochemical device structure on a plate electrode and running a circular disk-shaped rotating electrode on the peripheral portions of the flat type electrochemical device structure.

8. The fabricating method according to claim 5, wherein said laser beam welding is done using a YAG laser.

* * * * *